United States Patent
Min (10) Patent No.: US 10,367,165 B2
(45) Date of Patent: Jul. 30, 2019

(54) FLEXIBLE DISPLAY DEVICE

(71) Applicant: SAMSUNG DISPLAY CO., LTD., Yongin-si, Gyeonggi-do (KR)

(72) Inventor: Jin Sic Min, Busan (KR)

(73) Assignee: Samsung Display Co., Ltd., Yongin-si (KR)

(*) Notice: Subject to any disclaimer, the term of this patent is extended or adjusted under 35 U.S.C. 154(b) by 786 days.

(21) Appl. No.: 14/979,344

(22) Filed: Dec. 22, 2015

(65) Prior Publication Data

US 2016/0307512 A1    Oct. 20, 2016

(30) Foreign Application Priority Data

Apr. 16, 2015 (KR) ......................... 10-2015-0054043

(51) Int. Cl.
*H01L 51/52* (2006.01)
*H01L 51/00* (2006.01)
*G09G 3/3208* (2016.01)

(52) U.S. Cl.
CPC ...... *H01L 51/5237* (2013.01); *H01L 51/0097* (2013.01); *G09G 3/3208* (2013.01); *G09G 2380/02* (2013.01); *H01L 2251/5338* (2013.01); *Y02E 10/549* (2013.01)

(58) Field of Classification Search
USPC ................................................. 361/760, 761
See application file for complete search history.

(56) References Cited

U.S. PATENT DOCUMENTS

2016/0179229 A1* 6/2016 Ahn ..................... G06F 3/041
                                                     345/173

FOREIGN PATENT DOCUMENTS

| KR | 2000-0020563 A | 4/2000 |
|---|---|---|
| KR | 2000-0076592 A | 12/2000 |
| KR | 10-2006-0031343 A | 4/2006 |
| KR | 10-0943731 B1 | 2/2010 |
| KR | 10-2011-0056960 A | 5/2011 |
| KR | 10-2013-0053280 A | 5/2013 |

* cited by examiner

*Primary Examiner* — Andargie M Aychillhum
(74) *Attorney, Agent, or Firm* — Lewis Roca Rothgerber Christie LLP (57) ABSTRACT

A flexible display device according to an example embodiment includes: a substrate; a driver integrated circuit (IC) in a non-display portion of the substrate and configured to supply a driving voltage to a display portion of the substrate; a flexible printed circuit board attached to the non-display portion at an outer side of the driver IC; and a printed circuit board attached to the flexible printed circuit board and configured to transfer the driving voltage to the driver IC, wherein the driver IC comprises a base layer, a plurality of bumps at a bottom surface of the base layer, a first layer at an upper surface of the base layer, and second layers at the first layer to correspond to locations of the plurality of bumps.

11 Claims, 10 Drawing Sheets

FLEXIBLE DISPLAY DEVICE

CROSS-REFERENCE TO RELATED APPLICATION

This application claims priority to and the benefit of Korean Patent Application No. 10-2015-0054043 filed in the Korean Intellectual Property Office on Apr. 16, 2015, the entire content of which is incorporated herein by reference.

BACKGROUND

1. Field

Aspects of embodiments of the present invention relate to a flexible display device.

2. Description of the Related Art

Related art flexible display devices may be manufactured using a flexible plastic substrate such as a low temperature poly-silicon (LIPS), polyimide, and the like. A pixel array is formed on the flexible substrate, and the pixel array includes data lines and gate lines formed to cross each other, a thin film transistor (TFT), and a pixel electrode.

A driver IC is formed at an outer side of the flexible substrate to supply a driving signal and a voltage to the pixel array. In this case, the driver IC is formed of a gate driver IC and a data driver IC, and is formed using a chip on glass (COG) method, a chip on plastic (COP) method, or a chip on film (COF) method.

In addition, a printed circuit board (PCB) including a driver circuit other than the driver IC is connected to the flexible substrate using a flexible printed circuit board (FPCB). The driver IC is connected to a pad formed in the flexible substrate through a plurality of bumps, and supplies a driving voltage VCC, a ground voltage GND, a data output signal, and an enable signal to the pixel array of the flexible substrate.

The driver IC is attached to an outer portion of the substrate by thermal compression, and a compression tool applies a predetermined temperature and pressure to the driver IC such that the driver IC is compressed.

The thermal compression is applicable to a rigid driver IC, but a problem may occur when the thermal compression is applied to a flexible driver IC of a flexible display device. Thus, a shock absorbing member may be provided between the compression toll and the driver IC, and when the compression tool presses the driver IC, the shock absorbing member may press a center portion of the driver IC, and thus the driver IC may subside in a portion where no bumps are provided such that subsidence damage and cracks may occur in the driver IC around the bumps.

The above information disclosed in this Background section is only to enhance the understanding of the background of the invention, and therefore it may contain information that does not constitute prior art.

SUMMARY

Aspects of embodiments of the present invention relate to a flexible display device, and a flexible display device including a driver integrated circuit (IC) formed at an outer side of a flexible substrate.

According to aspects of embodiments of the present invention, a flexible display device includes a plastic layer of a driver IC that is formed as a double layer and protruding layers are formed corresponding to locations where bumps are formed, thereby preventing or reducing defects such as subsidence damage, cracks, and the like of the driver IC due to the presence of a shock absorbing member during thermal compression.

A flexible display device according to some example embodiments includes: a substrate; a driver integrated circuit (IC) in a non-display portion of the substrate and configured to supply a driving voltage to a display portion of the substrate; a flexible printed circuit board attached to the non-display portion at an outer side of the driver IC; and a printed circuit board attached to the flexible printed circuit board and configured to transfer the driving voltage to the driver IC, wherein the driver IC comprises a base layer, a plurality of bumps at a bottom surface of the base layer, a first layer at an upper surface of the base layer, and second layers at the first layer to correspond to locations of the plurality of bumps.

The plurality of bumps at the bottom surface of the base layer may be electrically connected to a substrate pad portion on the substrate.

The base layer may be attached to the substrate by an anisotropic conductive film.

The plurality of bumps may be distributed across the bottom surface of the base layer, and the second layers may be in a shape of a closed loop on the first layer to correspond to locations of the bumps.

The plurality of bumps may be distributed across the bottom surface of the base layer, and the second layers may be in a shape of an island on the first layer to correspond to locations of the bumps.

The base layer may include silicon.

The first layer and the second layers may include polyimide (PI) or polyethylene terephthalate (PET).

The plurality of bumps may include at least one of one of gold (Au), silver (Ag), or copper (Cu).

The first layer and the second layers may be integrally formed on the base layer in a shape of protrusions in locations that correspond to locations of the plurality of bumps.

The first layer and the second layers may be integrally formed on the base layer corresponding only to locations of the plurality of bumps.

A display element layer including an organic light emitting element and a thin film encapsulation layer covering the substrate and the display element layer may be formed at the display portion.

According to some example embodiments, in the flexible display device, the driver IC may be formed as a double layer at an outer side of the substrate of the flexible display device and layers may be formed in the shape of protrusions corresponding to locations where bumps are formed so that instances of subsidence damage and cracks of the driver IC due to the shock absorbing member during a thermal compression process can be prevented or reduced.

DETAILED DESCRIPTION

Aspects of some embodiments of the present invention will be described more fully hereinafter with reference to the accompanying drawings, in which example embodiments of the present invention are shown. As those skilled in the art would realize, the described embodiments may be modified in various different ways, all without departing from the spirit or scope of the present invention.

Further, in example embodiments, because like reference numerals designate like elements having the same configuration, a first example embodiment is representatively described, and in other example embodiments, aspects of configurations that differ from the first example embodiment will be described. That is, some repetitive description of the same or similar features may be omitted for brevity.

It is noted that the drawings are schematic, and not illustrated in accordance with a scale. Relative dimensions and ratios of portions in the drawings are illustrated to be exaggerated or reduced in size for clarity and convenience in the drawings, and any dimensions are just examples and are not limiting. In addition, like structures, elements, or components illustrated in two or more drawings use like reference numerals to show similar features. It will be understood that when an element such as a layer, film, region, or substrate is referred to as being "on" another element, it can be directly on the other element or intervening elements may also be present.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The example embodiments show example embodiments in some detail. As a result, various modifications to the described embodiments are still within the spirit and scope of the present invention. Therefore, the example embodiments are not limited to a specific aspect of an illustrated region, and for example, include modifications made for manufacturing.

Hereinafter, a flexible display device according to an example embodiment will be described with reference to FIG. 1 and FIG. 2.

Figure 1:
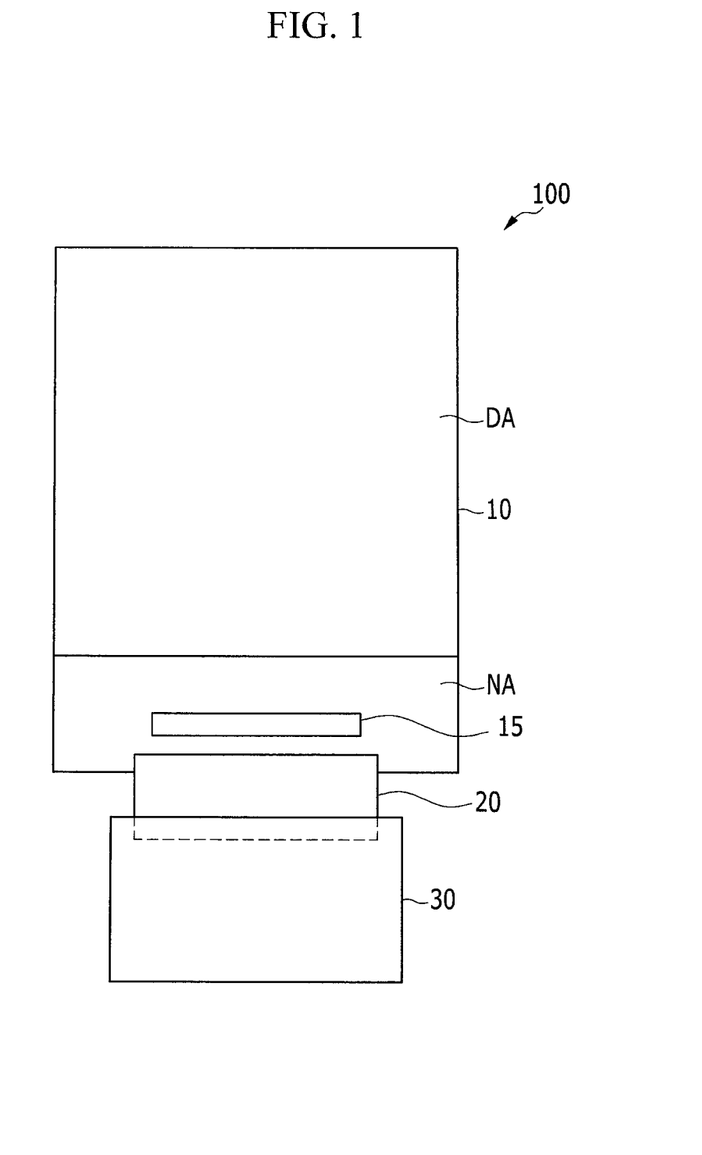
FIG. 1 is a schematic top plan view of a flexible display device according to some example embodiments of the present invention.
Figure 2A:
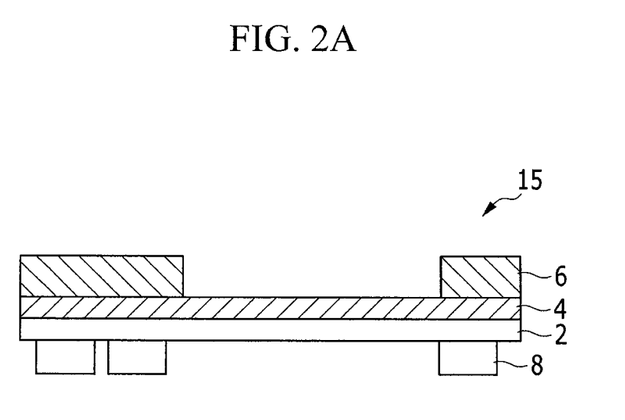
FIG. 2A is a schematic cross-sectional view of a driver IC of the flexible display device according to some example embodiments of the present invention.
Figure 2B:
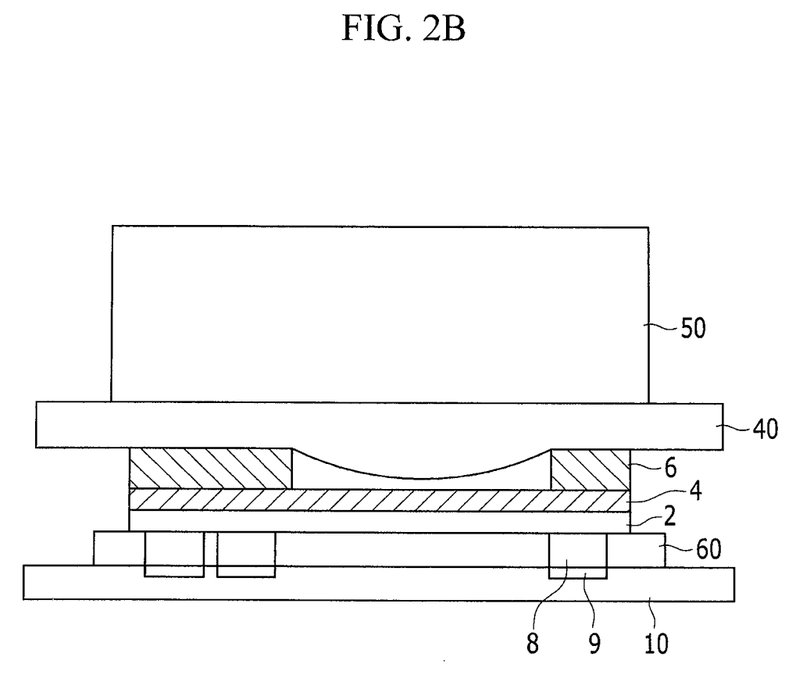
FIG. 2B is a schematic cross-sectional view of a connection relationship of the driver IC of the flexible display device according to some example embodiments of the present invention.

FIG. 1 is a top plan view of a flexible display device according to an example embodiment, FIG. 2A is a schematic cross-sectional view of a driver IC of the flexible display device according to the example embodiment, and FIG. 2B is a schematic cross-sectional view of a connection relationship of the driver IC of the flexible display device according to the example embodiment.

Referring to FIG. 1, FIG. 2A, and FIG. 2B, a flexible display device 100 according to an example embodiment includes a substrate 10, a driver IC 15 provided in a non-display portion NA of the substrate 10 and supplying a driving voltage to a display portion DA, an FPCB 20 attached to the non-display portion NA at the outer side of the driver IC 15, and a PCB 30 attached to the PFCB 20 and transmitting the driving voltage to the driver IC 15 of the substrate 10.

The substrate 10 may be formed by coating a plastic material such as a low temperature poly silicon (LTPS), polyimide, and the like such that the substrate 10 has flexibility.

The substrate 10 may be divided into a display portion (or display area) DA and a non-display portion (or non-display area) NA, and a display element layer including an organic light emitting element and a thin film encapsulation layer covering and protecting the substrate 10, and the display element layer may be formed in the display portion DA. The display element layer includes an element region where an active element such as a thin film transistor (TFT) is formed and a light emission region where an emission layer is formed. The element region and the light emission region may be separated from each other or may overlap each other. A pixel array is formed on the display portion DA. The pixel array includes a plurality of data lines and a plurality of gate lines that alternately cross each other, a thin film transistor, and a pixel electrode.

The thin film encapsulation layer is formed on the display element layer, and faces opposite to the substrate 10. The thin film encapsulation layer may prevent or reduce instances of oxygen and moisture entering from the outside to protect the display element layer.

The driver IC 15 is arranged or located in the non-display portion NA. The driving IC 15 is a part where a circuit chip and the like are installed, and it converts a driving signal input from the PCB 30 through the FPCB 20 attached to the non-display portion NA and supplies the converted driving signal to the display portion DA. In the example embodiments, the driver IC 15 is arranged or located, for example, in the non-display portion NA, but the driver IC 15 may be installed in the FPCB 20.

As shown in FIG. 2A, the driving IC 15 includes a base layer 2, a plurality of bumps 8 formed in the bottom surface of the base layer 2, a first layer 4 formed on the upper surface of the base layer 2, and second layers 6 formed on the first layer 4 to correspond to locations where the plurality of bumps 8 are formed.

The base layer 2 may be made of silicon, and the first layer 4 and the second layer 6 may be made of a flexible and heat-resistive material such as polyimide (PI) or polyethylene terephthalate (PET). In addition, the plurality of bumps 8 may be made of one of gold (Au), silver (Ag), copper (Cu), and the like.

As shown in FIG. 2B, the plurality of bumps 8 formed in the bottom surface of the base layer 2 are electrically connected to a plurality of substrate pad portion 9 formed on the substrate 10.

In order to attach the driving IC 15 to the substrate 10, the driver IC 15 is pressed using a compression tool 50, interposing a shock-absorbing member 40 therebetween. Pressure of about 30 Mpa to about 150 Mpa is applied to the compression tool 50 with a temperature of about 200° C. to about 500° C. for thermal compression of the driver IC 15 to the substrate 10. The shock absorbing member 40 provided between the compression tool 50 and the driving IC 15 is made of a material such as sponge, and since the shock absorbing member 40 is replaceable and can compensate for flatness of the driver IC, the shock absorbing member 40 may prevent or reduce instances of foreign materials remaining in the driver IC 15. The shock absorbing member 40 is made of any suitable shock absorbing material, such as silicon, Teflon® (e.g., polytetrafluoroethylene), and the like.

The second layers 6 are formed on the first layer 4 corresponding to the locations where the plurality of bumps 8 are formed. That is, the second layers 6 are formed to protrude on the first layer 4, and the shock absorbing member 40 arranged or positioned on the second layers 6 is pressed and thus a center portion of the shock absorbing member 40 is inserted into a space between the first layer 4 and the second layers 6. Accordingly, subsidence of the driver IC due to the pressed shock absorbing member 40 and instances of subsidence damage and cracks around the bumps 8 due to the subsidence of the driver IC can be prevented or reduced.

Meanwhile, the second layer 2 is attached to the substrate 10 by an anisotropic conductive film (ACF). The anisotropic conductive film fills between the substrate 10 and the driving IC 15 and is cured such that the driving IC 15 can be fixed to the substrate 10. The anisotropic conductive layer may include a polymer and conductive particles included in the polymer, and the conductive particles are arranged or positioned between the bumps 8 and the substrate pad portion 9 such that the substrate 10 and the driver IC can be electrically connected with each other.

Figure 3:
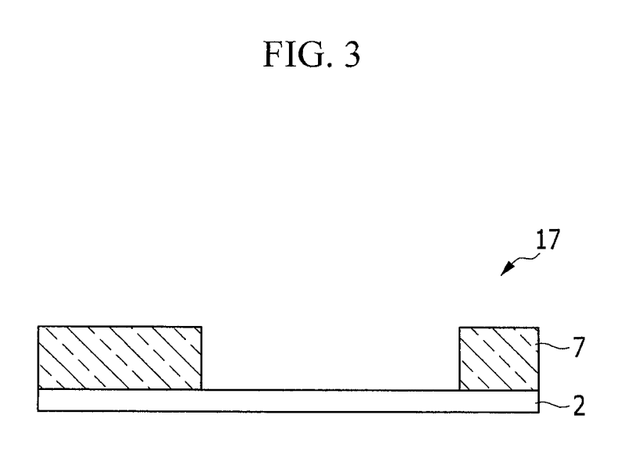
FIG. 3 is a schematic cross-sectional view of a driver IC of a flexible display device according to some example embodiments of the present invention.
Figure 4:
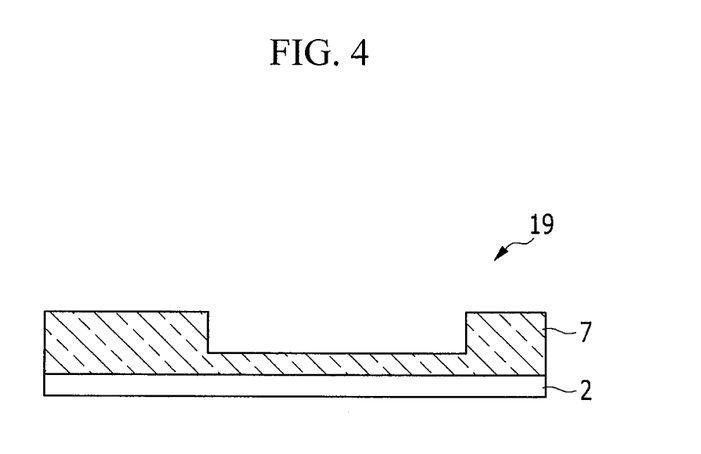
FIG. 4 is a schematic cross-sectional view of a driver IC of a flexible display device according to some example embodiments of the present invention.

FIG. 3 is a cross-sectional view of a driver IC of a flexible display device according to another example embodiment. As shown in FIG. 3, a driving IC 17 may be single layers 7 formed by integrally forming a first layer and second layers on a base layer 2, and the integrally formed single layers 7 may be formed on the base layer 2 corresponding to locations where a plurality of bumps 8 are formed. FIG. 4 is a schematic cross-sectional view of a driver IC of a flexible display device according to another example embodiment. As shown in FIG. 4, an integrally formed single layer 7 of a driving IC 19 may be formed to protrude from the base layer 2 corresponding to locations where a plurality of bumps 8 are formed.

Figure 5A:
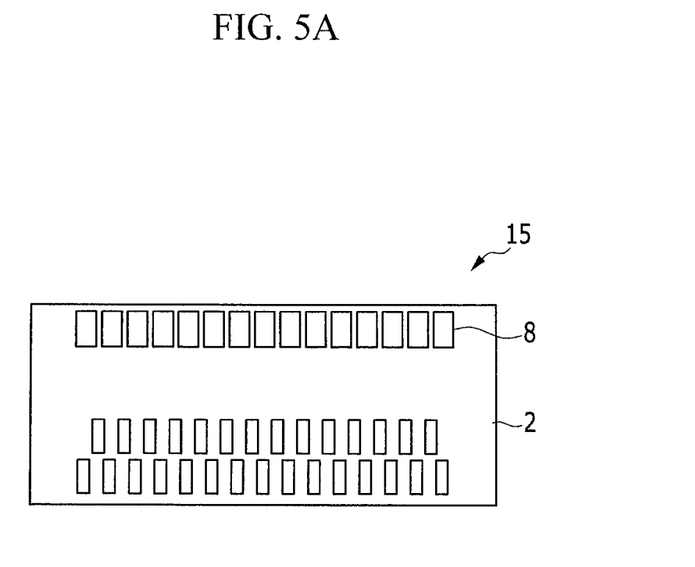
FIG. 5A is a schematic bottom view of a driver IC according to some example embodiments of the present invention.
Figure 5B:
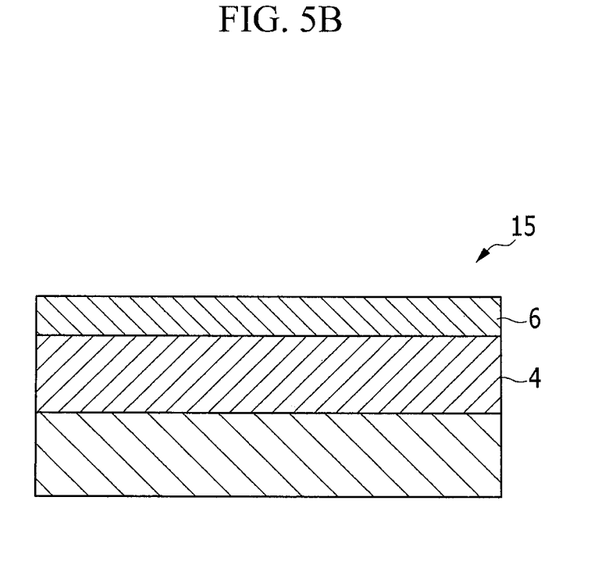
FIG. 5B is a schematic top view of a driver IC according to some example embodiments of the present invention.

FIG. 5A schematically shows a bottom surface of a driver IC according to an example embodiment, and FIG. 5B schematically shows a top surface of the driver IC according to the example embodiment.

Referring to FIG. 5A and FIG. 5B, a plurality of bumps 8 of a driver IC 15 are linearly arranged in the bottom surface of a base layer 2, a first layer 4 is arranged or formed on the top surface of the base layer 2, and second layers 6 are linearly arranged on the first layer 4 so as to correspond to locations where the plurality of bumps 8 are formed. Because the second layers 6 are formed to protrude from the first layer 4, a space where a shock absorbing member 40 subsides when thermal compression is performed is formed, such that instances of subsidence damage of the driver IC 15 due to the pressed shock absorbing member 40 can be prevented or reduced.

Figure 6A:
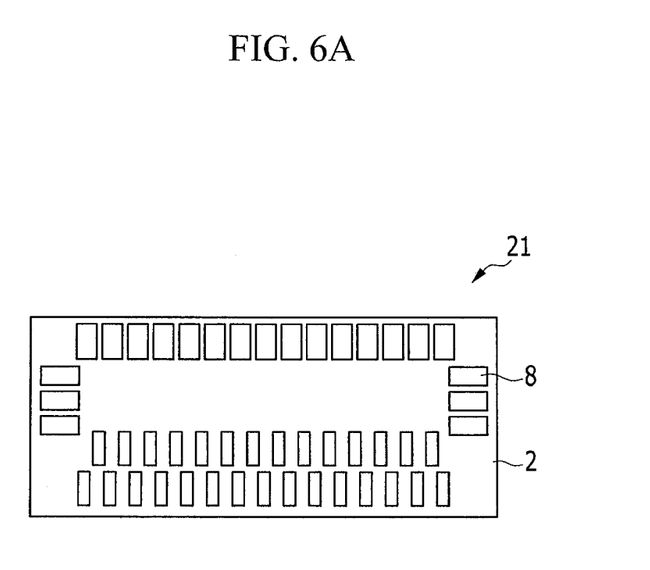
FIG. 6A is a schematic bottom view of a driver IC according to some example embodiments of the present invention.
Figure 6B:
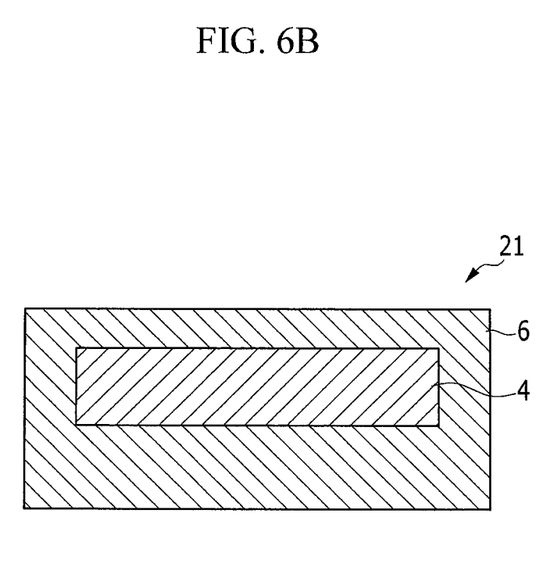
FIG. 6B is a schematic top view of the driver IC according to some example embodiments of the present invention.
Figure 6C:
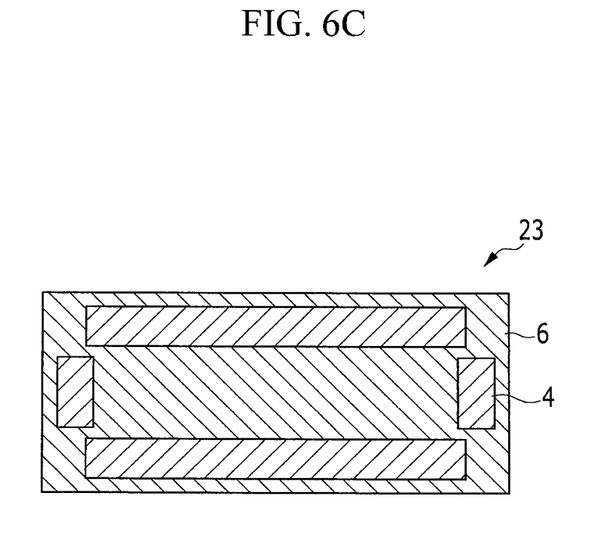
FIG. 6C is a schematic top view of a driver IC according to according to some example embodiments of the present invention.

FIG. 6A is a schematic bottom view of a driver IC according to another example embodiment, FIG. 6B is a schematic top view of a driver IC according to another example embodiment, and FIG. 6C is a schematic top view of a driver IC according to another example embodiment.

As shown in FIG. 6A, a plurality of bumps 8 of a driving IC 15 may be formed everywhere in (e.g., distributed across, for example, in regular or even intervals) the bottom surface of a base layer 2. In this case, as shown in FIG. 6B, second layers 6 may be formed in the shape of a closed loop on a first layer 4 so as to correspond to locations where the plurality of bumps 8 are formed. Further, as shown in FIG. 6C, the second layers 6 may be formed in the shape of an island rather than being formed in the shape of a closed loop on the first layer 4.

As described, in the flexible display devices according to the example embodiments, the driver IC is formed as a double layer at an outer side of the substrate of the flexible display device, and layers are formed in the shape of protrusions corresponding to locations where bumps are formed so that instances of subsidence damage and cracks of the driver IC due to the shock absorbing member during a thermal compression process can be prevented or reduced.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims, and their equivalents.

| Description of Some of the Symbols | |
|---|---|
| 100: flexible display device | 10: substrate |
| 15, 17, 19: driving IC | 20: FPCB |
| 30: PCB | 40: shock absorbing member |
| 50: compression tool | 60: anisotropic conductive layer |
| 2: base layer | 4: first layer |
| 6: second layer | 8: bump |
| 9: substrate pad portion | |

What is claimed is:

1. A flexible display device comprising:
   a substrate;
   a driver integrated circuit (IC) in a non-display portion of the substrate and configured to supply a driving voltage to a display portion of the substrate;
   a flexible printed circuit board attached to the non-display portion at an outer side of the driver IC; and
   a printed circuit board attached to the flexible printed circuit board and configured to transfer the driving voltage to the driver IC,
   wherein the driver IC comprises a base layer attached to the substrate, a plurality of bumps at a bottom surface of the base layer, a first layer at an upper surface of the base layer, and second layers disposed on the first layer to correspond to locations of the plurality of bumps.

2. The flexible display device of claim 1, wherein the plurality of bumps at the bottom surface of the base layer are electrically connected to a substrate pad portion on the substrate.

3. The flexible display device of claim 1, wherein the base layer is attached to the substrate by an anisotropic conductive film.

4. The flexible display device of claim 1, wherein the plurality of bumps are distributed across the bottom surface of the base layer, and the second layers are in a shape of a closed loop on the first layer to correspond to locations of the bumps.

5. The flexible display device of claim 1, wherein the plurality of bumps are distributed across the bottom surface of the base layer, and the second layers are in a shape of an island on the first layer to correspond to locations of the bumps.

6. The flexible display device of claim 1, wherein the base layer comprises silicon.

7. The flexible display device of claim 1, wherein the first layer and the second layers comprise polyimide (PI) or polyethylene terephthalate (PET).

8. The flexible display device of claim 1, wherein the plurality of bumps comprise at least one of one of gold (Au), silver (Ag), or copper (Cu).

9. The flexible display device of claim 1, wherein the first layer and the second layers are integrally formed on the base layer in a shape of protrusions in locations that correspond to locations of the plurality of bumps.

10. The flexible display device of claim 1, wherein the first layer and the second layers are integrally formed on the base layer corresponding only to locations of the plurality of bumps.

11. The flexible display device of claim 1, wherein a display element layer comprising an organic light emitting element and a thin film encapsulation layer covering the substrate and the display element layer are formed at the display portion.

* * * * *